(12) United States Patent
Kim et al.

(10) Patent No.: US 6,664,191 B1
(45) Date of Patent: Dec. 16, 2003

(54) NON SELF-ALIGNED SHALLOW TRENCH ISOLATION PROCESS WITH DISPOSABLE SPACE TO DEFINE SUB-LITHOGRAPHIC POLY SPACE

(75) Inventors: Unsoon Kim, Santa Clara, CA (US); Yider Wu, Campbell, CA (US); Yu Sun, Saratoga, CA (US); Michael K. Templeton, Atherton, CA (US); Angela T. Hui, Fremont, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 93 days.

(21) Appl. No.: 09/973,131

(22) Filed: Oct. 9, 2001

(51) Int. Cl.$^7$ ............................................. H01L 21/302
(52) U.S. Cl. ...................... 438/700; 438/725; 438/975
(58) Field of Search ................. 438/313, 316, 438/325, 700, 706, 725, 975

(56) References Cited

U.S. PATENT DOCUMENTS

| 5,441,914 A | * | 8/1995 | Taft et al. ................... 438/592 |
| 5,538,922 A | | 7/1996 | Cooper et al. |
| 5,981,341 A | * | 11/1999 | Kim et al. ................... 438/264 |
| 6,001,687 A | | 12/1999 | Chu et al. |
| 6,034,894 A | | 3/2000 | Maruyama et al. |
| 6,063,548 A | * | 5/2000 | Chu et al. ................... 430/314 |
| 6,140,182 A | * | 10/2000 | Chen ........................... 438/259 |
| 6,146,955 A | * | 11/2000 | Lee ............................. 438/305 |
| 6,153,471 A | | 11/2000 | Lee et al. |
| 6,184,092 B1 | | 2/2001 | Tseng et al. |
| 6,228,713 B1 | | 5/2001 | Pradeep et al. |
| 6,232,185 B1 | | 5/2001 | Wang |
| 6,329,124 B1 | * | 12/2001 | Rangarajan et al. ........ 430/313 |

* cited by examiner

Primary Examiner—Kin-Chan Chen
(74) Attorney, Agent, or Firm—Amin & Turocy, LLP

(57) ABSTRACT

A method is provided of forming lines with spaces between memory cells below a minimum printing dimension of a photolithographic tool set. In one aspect of the invention, lines and spaces are formed in a first polysilicon layer that forms floating gates of flash memory cells. STI regions are formed between adjacent memory cells in a substrate to isolate the cells from one another. The first polysilicon layer is deposited over the substrate covering the STI regions. The first polysilicon layer is then planarized by a CMP process or the like to eliminate overlay issues associated with the STI regions. A hard mask layer is deposited over the first polysilicon layer and a first space dimension $d_1$ etched between adjacent memory cells. A conformal nitride layer is deposited over the hard mask layer and an etch step performed to form nitride side walls adjacent the spaces. The nitride side walls reduce the first space dimension to a second space dimension $d_2$, so that spaces can be formed in the first polysilicon layer at a dimension smaller than the minimum printable dimension of the photolithographic tool set.

29 Claims, 10 Drawing Sheets

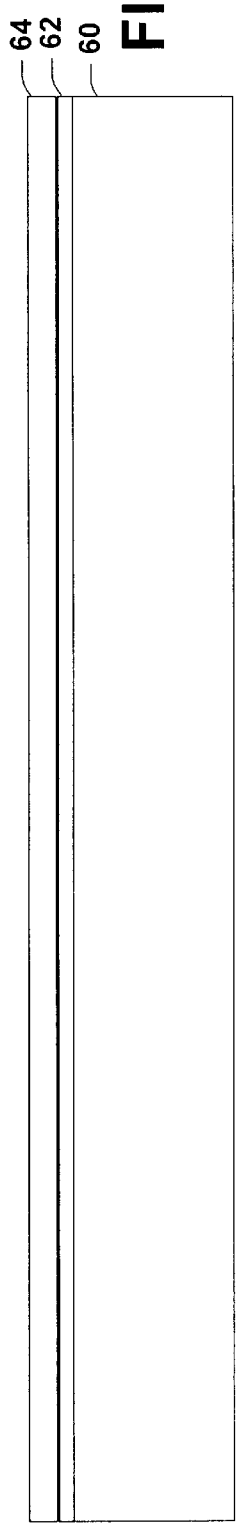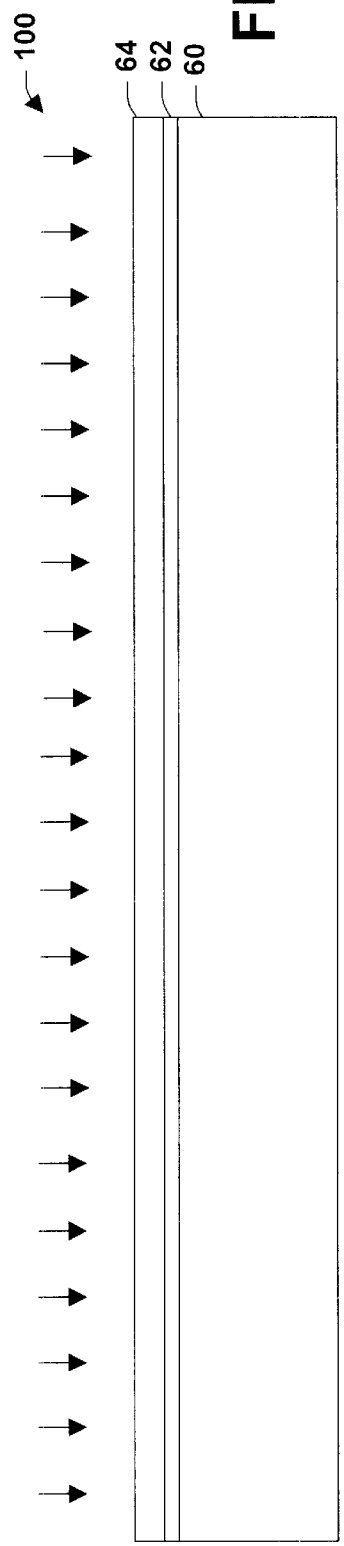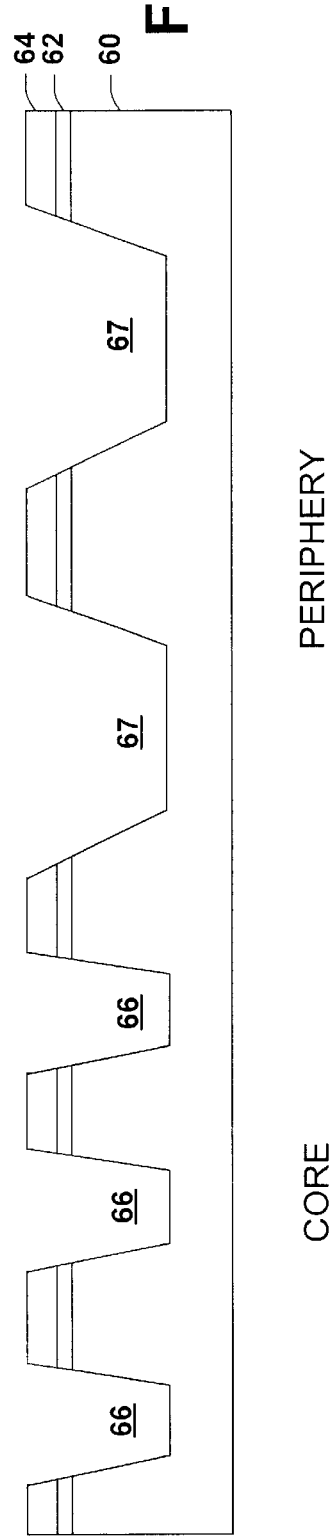

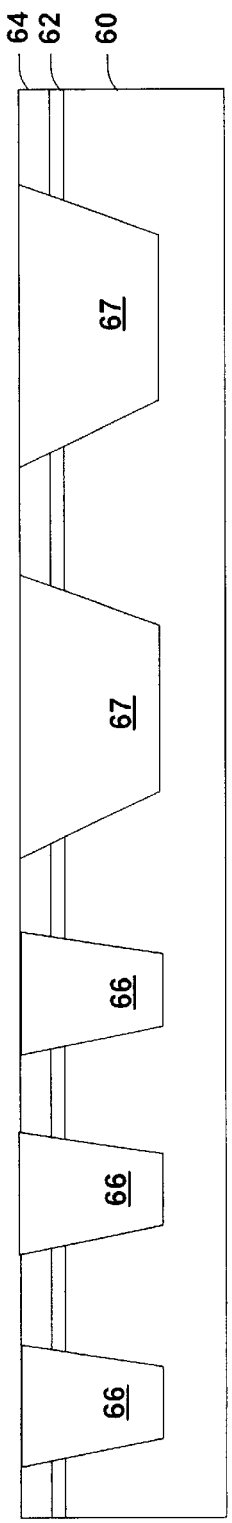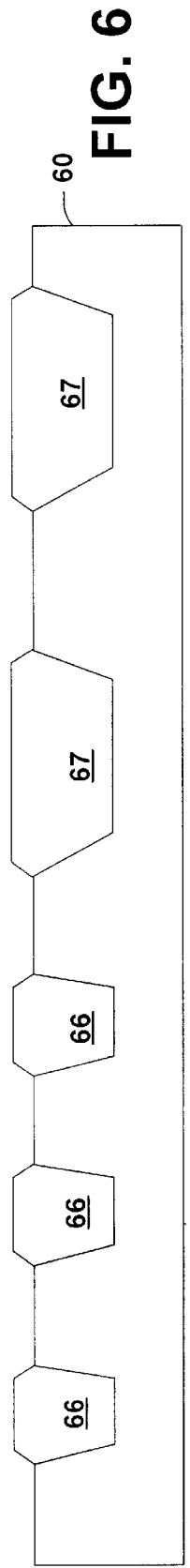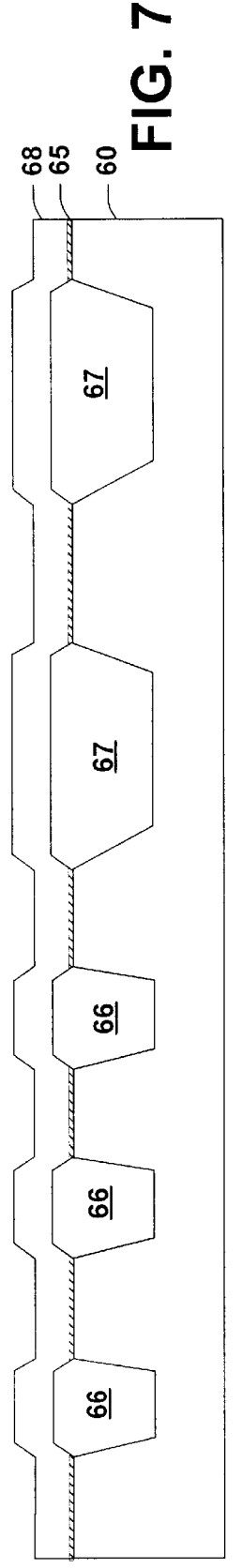

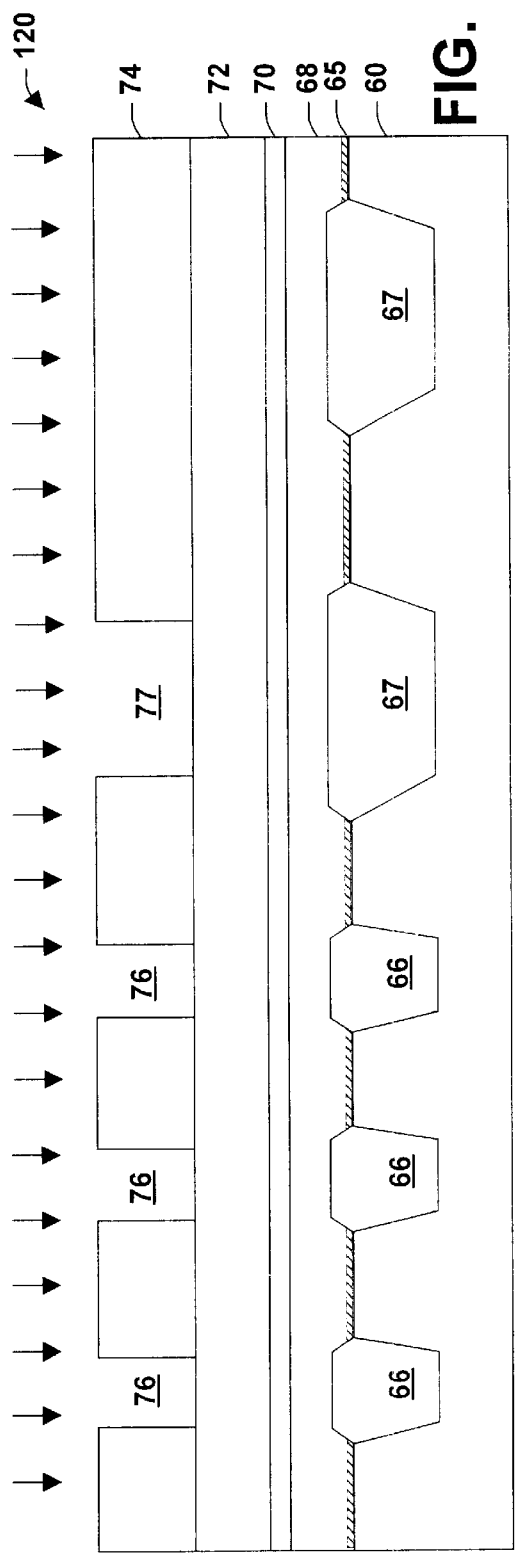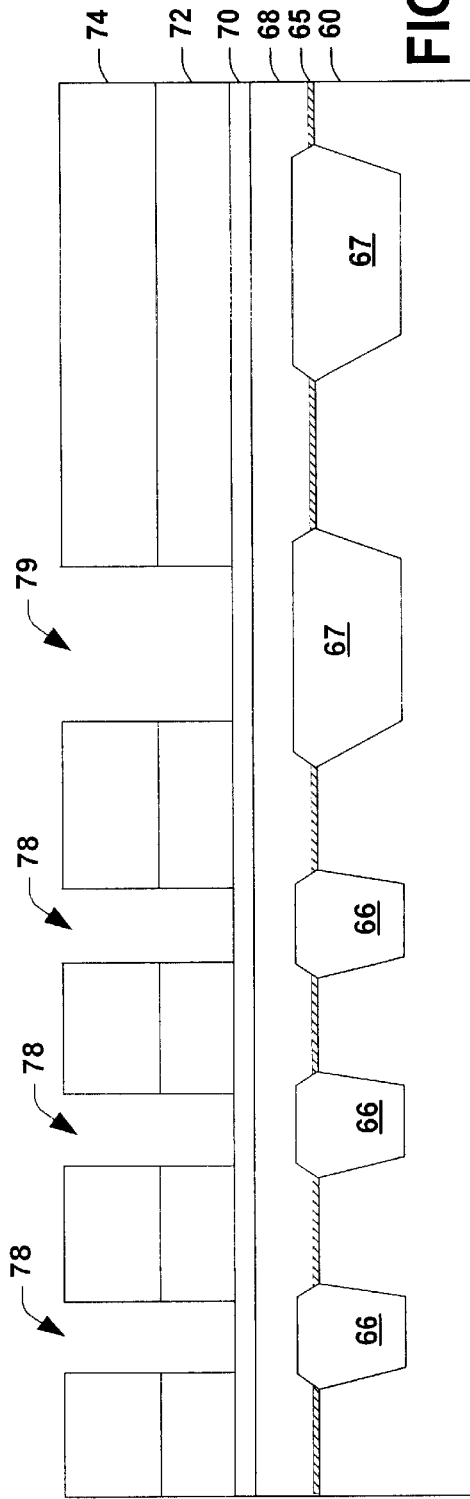

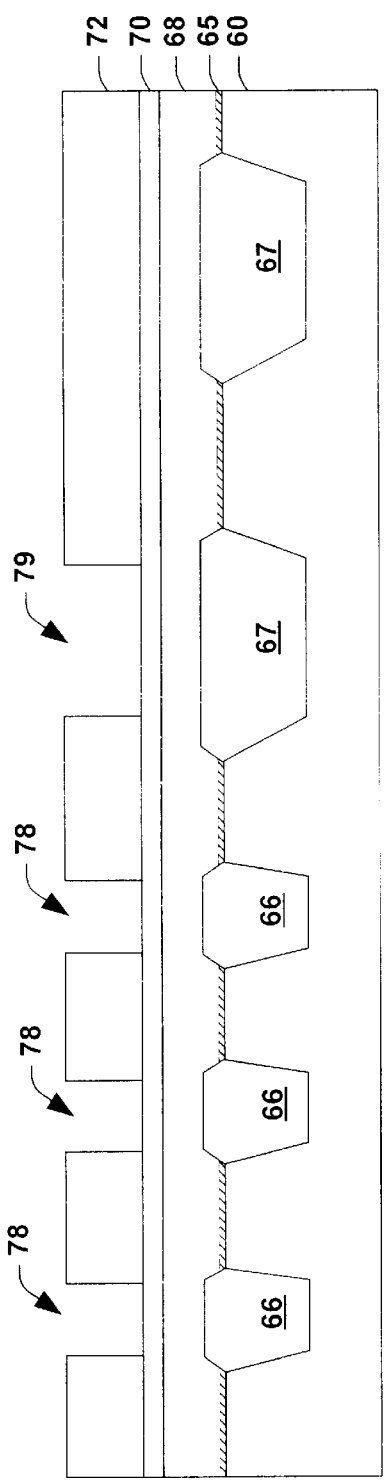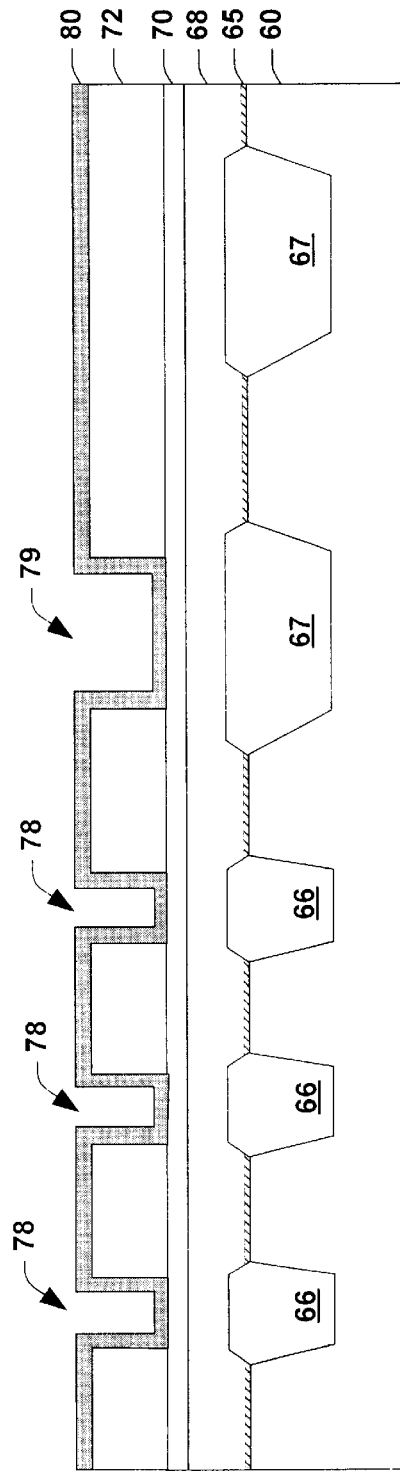

NON SELF-ALIGNED SHALLOW TRENCH ISOLATION PROCESS WITH DISPOSABLE SPACE TO DEFINE SUB-LITHOGRAPHIC POLY SPACE

TECHNICAL FIELD

The present invention generally relates to semiconductor processing, and in particular to a method for producing small space patterns during fabrication of memory devices.

BACKGROUND

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the photo mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the photomask causes the image area to become either more or less soluble (depending on the coating) in a particular solvent developer. The more soluble areas are removed in the developing process to leave the pattern image in the coating as less soluble polymer.

The spacing between adjacent lines of an integrated circuit is an important dimension, and ever continuing efforts are made toward reducing such spacing dimension. The wavelength of light used in the photolithographic process along with the lithographic tool set employed in the process generally dictate the spacing dimension. For example, a tool set designed to provide lines and/or spaces at 0.12 μm does not achieve consistent lines and/or spacing at its minimum range of 0.12 μm but rather is employed to generate lines and/or spacing above the minimum range (e.g., 0.14 μm) with fairly consistent results.

Conventional flash memory cells allow for a high packing density. Each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The width of the word lines and conductive bit lines are limited by the wavelength of light used in the photolithographic process along with the lithographic tool set employed in the process of fabricating the trenches for forming the bit lines. Furthermore, shallow trench isolation (STI) has been gradually replacing LOCOS in fabrication of memory devices due to its improved utilization of real state. However, the use of STI also contributes to problems associated with consistent lines and/or spacing at a minimum range of the lithographic tool due to overlay issues that exist around the STI edges.

In view of the above, it would be desirable for a technique which allows for a particular lithographic tool set to be employed and achieve consistent lines and/or spacing between lines at the minimum range of the tool set and even below the minimum range during fabrication of memory cells employing a STI process.

SUMMARY

The following presents a simplified summary of the invention in order to provide a basic understanding of some aspects of the invention. This summary is not an extensive overview of the invention. It is not intended to identify key or critical elements of the invention or to delineate the scope of the invention. Its sole purpose is to present some concepts of the invention in a simplified form as a prelude to the more detailed description that is presented later.

The present invention relates to a method of fabricating memory cells employing a non self-aligned STI process. The present invention employs a photolithographic tool set and achieves substantially consistent spacing dimensions below the minimum range of the tool set during fabrication of stacked floating gate memory cells using shallow trench isolation (STI) regions between memory cells. STI regions are formed in both a core region and a periphery region of a substrate. A first polysilicon layer is formed over the substrate and the STI regions. The first polysilicon layer is planarized by a chemical mechanical polish (CMP) to eliminate STI overlay issues. A stop layer and a mask layer (e.g., SiN layer) are then deposited over the planarized polysilicon layer. A photoresist layer is deposited over the mask layer. A given photolithographic tool set is employed to pattern a photoresist layer in a desired fashion. The tool set is capable of achieving a smallest spacing dimension between adjacent lines of $d_1$.

After the photoresist layer is patterned, an etch step is performed to etch the pattern in the underlying mask layer. The photoresist layer is then stripped from the mask layer. Next, a nitride layer is conformably deposited over the patterned mask layer. Thereafter, a directional etch is performed to remove a particular amount of the nitride layer (preferably a thickness equivalent to the thickness of the nitride layer residing over the mask layer). The directional etch leaves nitride sidewalls along the patterned mask layer which result in a reduction in dimension size of exposed areas interposed between adjacent mask portions. Thus, a spacing dimension size ($d_2$) of exposed areas is substantially less than the spacing dimension size ($d_1$) of exposed areas prior to the depositing the nitride layer. An etch step is performed to etch layers underlying the mask layer. Adjacent lines etched from one of the underlayers will have a smallest spacing design dimension of $d_2$ as compared to $d_1$. Thus, the present invention provides for achieving spacing dimensions between lines at and below a minimum patterning range for a particular lithographic tool set.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 2 is a schematic cross-sectional illustration of a substrate with a barrier oxide layer and nitride layer formed thereon in accordance with the present invention.

FIG. 3 is a schematic cross-sectional illustration of the structure of FIG. 2 undergoing an etch step to form isolation trenches in accordance with the present invention.

FIG. 4 is a schematic cross-sectional illustration of the structure of FIG. 3 after undergoing an etch step to form isolation trenches in accordance with the present invention.

FIG. 5 is a schematic cross-sectional illustration of the structure of FIG. 4 with an oxide layer formed thereon so as to fill the isolation trenches and after the oxide layer has been polished down to the surface of the nitride layer in accordance with the present invention.

FIG. 6 is a schematic cross-sectional illustration of the structure of FIG. 5 after the nitride layer, barrier oxide layer and portions of the oxide layer have been etched away in accordance with the present invention.

FIG. 7 is a schematic cross-sectional illustration of the structure of FIG. 6 after deposition of a tunneling oxide layer and a polysilicon layer in accordance with the present invention.

FIG. 13 is a schematic cross-sectional illustration of the structure of FIG. 12 undergoing an etch step on the exposed portions of the mask layer underlying the photoresist layer in accordance with the present invention.

FIG. 14 is a schematic cross-sectional illustration of the structure of FIG. 13 after undergoing an etch step on the exposed portions of the mask layer underlying the photoresist layer in accordance with the present invention.

FIG. 15 is a schematic cross-sectional illustration of the structure of FIG. 14 after undergoing a photoresist stripping process in accordance with the present invention.

FIG. 16 is a schematic cross-sectional illustration of the structure of FIG. 15 after undergoing a deposition process to conformably deposit a nitride layer on the structure and undergoing a directional etch step in accordance with the present invention.

DETAILED DESCRIPTION OF THE INVENTION

The present invention relates to a method of forming lines with spaces between memory cells below a minimum printing dimension of a photolithographic tool set. In one aspect of the invention, lines and spaces are formed in a first polysilicon layer that forms floating gates of flash memory cells. STI regions are formed between adjacent memory cells in a substrate to isolate the cells from one another. The first polysilicon layer is deposited over the substrate covering the STI regions. The first polysilicon layer is then planarized by a CMP process or the like to eliminate overlay issues associated with the STI regions. A hard mask layer is deposited over the first polysilicon layer and a first space dimension $d_1$ etched between adjacent memory cells. A conformal nitride layer is deposited over the hard mask layer and an etch step performed to form nitride side walls adjacent the spaces. The nitride side walls reduce the first space dimension to a second space dimension $d_2$, so that spaces can be formed in the first polysilicon layer at a dimension smaller than the minimum printable dimension of the photolithographic tool set.

Subsequent steps can then be performed to complete the memory cells with spaces between the memory cells in the first polysilicon layer being at a dimension $d_2$. For example, deposition of an insulating layer (e.g., ONO), subsequent gate oxidation steps, implant steps and deposition of a second polysilicon layer to form the control gates are typically performed during fabrication of a floating gate memory cells. Additional steps can also performed during fabrication of the lines and spaces in the first polysilicon layer, which would be apparent to those skilled in the art. Although the present invention is described with respect to forming lines and spaces in a first polysilicon layer of floating gate memory cells, it is to be appreciated that the present invention can be practiced in the context of other layers of memory cells and other types of memory cells.

Figure 1:
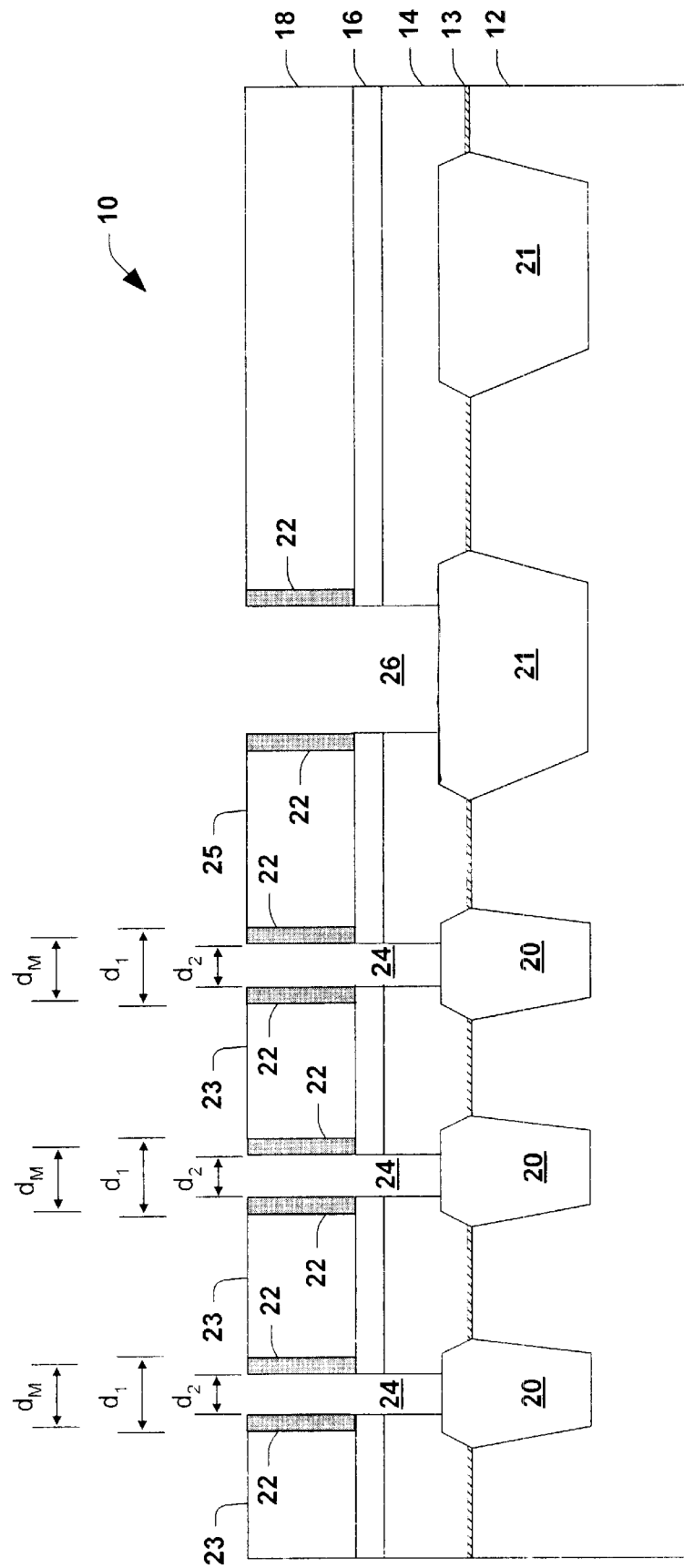
FIG. 1 is a schematic cross-sectional illustration of lines formed in accordance with the present invention.

The present invention will now be described with reference to the drawings. FIG. 1 illustrates a set of lines 23 formed in accordance with the present invention. The lines 23 are formed employing a photolithographic tool set (not shown) having a minimum feature printing dimension of $d_M$. More particularly, the smallest spacing between lines printable by the tool set has a dimension of $d_M$. However, consistent printing at the minimum spacing dimension $d_M$ is typically not possible. The tool set is capable of printing consistently at a spacing dimension of $d_1$ (which is larger than $d_M$). As can be seen from FIG. 1, the present invention provides for employing the particular tool set to form the lines 23 such that a spacing dimension ($d_2$) between adjacent lines, respectively, is achieved. The dimension $d_2$ is substantially less than dimensions $d_M$ and $d_1$.

FIG. 1 illustrates a substrate 12 during fabrication of a memory device 10 after undergoing an etch step to form spaces 24 having a dimension $d_2$ between lines 23 in a core region of the substrate. A line 25 is also formed in the periphery region of the substrate 12 with a space 26 residing on one side of the line 25 and a space 24 on the other side of the line 25. Typically, lines and spaces in the periphery region are larger than the core region where the memory cells are formed. Therefore, the minimum critical dimension would be in spaces 24 in the core region. However, to reduce processing steps the reduction of the dimension from $d_1$ to $d_2$ in the spaces 24 in the core region should be considered during formation of the line 25 and space 26 in the periphery region. A polysilicon layer 14 is disposed over the substrate 12 with a plurality of STI regions 20 residing in the core region and a plurality of STI regions 21 residing in the periphery region. A tunneling oxide layer 13 resides between the polysilicon layer 14 and the substrate 12. A stop layer 16 resides over the polysilicon layer 14 and a hard mask layer 18 resides over the stop layer 16. Side spacers 22 are formed in the mask layer 18 alongside the spaces 24 and 26. The side spacers 22 reduce the minimum dimension of the spaces 24 from $d_1$ to $d_2$ in the polysilicon layer 14 during a subsequent etch step of the polysilicon layer 14. The hard mask layer 18 and the stop layer 16 can then be removed.

FIGS. 2–21 illustrate in greater detail how the present invention provides for forming the lines 23 having a spacing dimension there between, respectively, of $d_2$ using the tool set which has a minimum print feature dimension of $d_M$ (which is substantially greater than $d_2$).

Thus, the present invention provides for a method for employing a conventional tool set to obtain minimum space dimensions well below the minimum space parameter typically achievable by the tool set. As a result, the present invention provides for a relatively low cost alternative to purchasing new photolithographic tool sets for achieving reduced spacing between lines.

FIGS. 2–6 illustrate process steps associated with fabrication of isolation regions of the memory device 10 (FIG. 1) in accordance with the present invention. The present process relates to shallow trench isolation (STI), which involves etching a trench into a top silicon layer 60 and filling the trench with an isolation material. Local oxidation of silicon (LOCOS) isolation processes generally occupy a great deal of wafer surface area, and thus STI provides for an alternative isolation technique. FIG. 2 illustrates a barrier oxide layer 62 and a layer of nitride 64 formed on the surface of the top silicon layer 60. The barrier oxide layer 62 has a thickness of approximately 200 Å and may be thermally grown at a temperature of approximately 900° C. for a period of 40 minutes. The nitride layer 64 is deposited on the surface of the barrier oxide layer 62 via a chemical vapor deposition (CVD) process to a thickness of approximately 2000 Å. A conventional photoresist process is then utilized to pattern and etch the nitride layer 64 and the barrier oxide layer 62. Such photoresist process includes use of an STI mask which defines isolation regions.

Next, a silicon etch is performed so as to form shallow trenches 66 in a core region and shallow trenches 67 in a peripheral region within the top silicon layer 60 at the isolation regions as illustrated in FIG. 4. In particular, a trench resist material (not shown) is applied to cover the structure and is then patterned to expose the isolation regions. The shallow trenches are then etched into the top silicon layer 60 using suitable techniques. Both etch steps are illustrated as a single etch step 100 in FIG. 3. The trench resist material is thereafter stripped.

Following the formation of the trenches via the silicon etch, a layer of oxide material is formed on the structure using high density plasma chemical vapor deposition (HDPCVD) in order to fill fully the isolation regions 66 and 67 with the oxide material. As is known, HDPCVD is a self-planarizing process which facilitates reduction of the chemical mechanical polishing (CMP) times required in subsequent steps. (See, e.g., Pye, J. T. et al., *High-density plasma CVD and CMP for 0.25 μm intermetal dielectric processing*, Solid State Technology, Dec. 1995, pgs. 65–71). Following deposition of the oxide material, the oxide material is polished via CMP down to the surface level of the nitride layer 64 as shown in FIG. 5. Consequently, the insulative oxide material in the trenches 66 remains. The upper surface of the oxide material is substantially even with the upper surface of the nitride layer 64. As is represented in FIG. 6, the nitride layer 64 is stripped away using a suitable stripping process and the barrier oxide layer 62 is etched away using a suitable etching process. Thus, the formation of the shallow isolation trenches 66 is substantially complete in relevant part.

Turning now to FIGS. 7–21, process steps in connection with completion of the memory device in accordance with the present invention are described. Although the present invention is described in the context of fabricating a floating gate type device it is to be appreciated that the present invention has applicability to a variety of memory devices and/or integrated circuits. The present description will enable those skilled in the art to practice the invention with respect to a vast number of different types of memory devices which are intended to fall within the scope of the invention as defined by the hereto appended claims.

Figure 8:
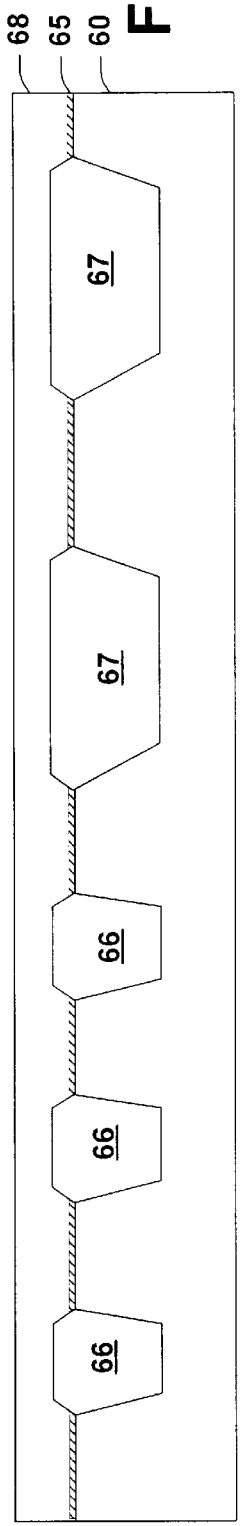
FIG. 8 is a schematic cross-sectional illustration of the structure of FIG. 7 after planarization of the polysilicon layer in accordance with the present invention.
Figure 9:
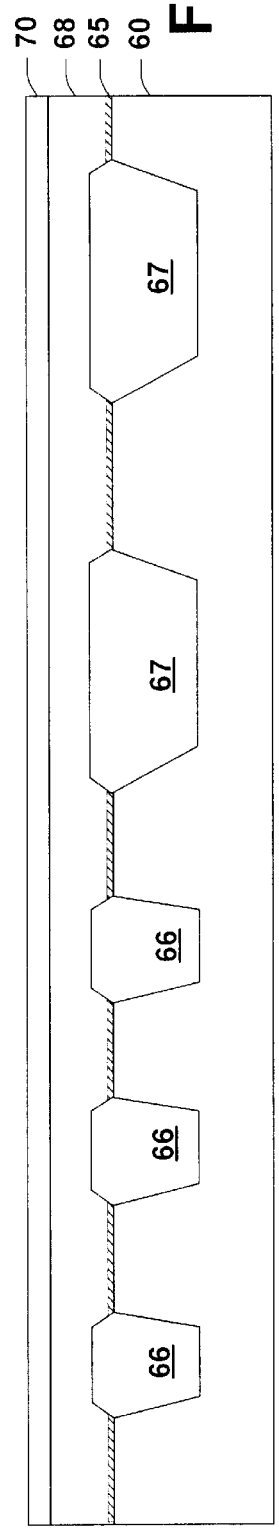
FIG. 9 is a schematic cross-sectional illustration of the structure of FIG. 8 after deposition of a stop layer over the polysilicon layer in accordance with the present invention.

FIG. 7 illustrates a polysilicon layer 68 being laid down over the top silicon layer 60 and the shallow trenches 66 and 67 and a tunneling oxide layer 65 residing between the polysilicon layer 68 and the top silicon layer 60. The polysilicon layer has a thickness of about 800 Å? to about 1500 Å. Since the shallow trenches are raised over the top silicon layer 60, the shallow trenches 66 and 66 create overlay issues around the shallow trench edge areas. Therefore, a chemical mechanical polish step is performed on the polysilicon layer 68 to provide a polysilicon layer 68 that is substantially planar. The resultant structure is illustrated in FIG. 8. The substantial planar polysilicon layer 68 also improves the uniformity of line widths in subsequent lithographic steps. A stop layer 70 is formed over the polysilicon layer 68 (FIG. 9) using CVD techniques. In one aspect of the invention, the etching stopping layer is high temperature oxide (HTO). The minimum thickness of the stop layer 70 is determined by the HTO selectivity during subsequent silicon nitride mask formation and silicon spacer etch steps.

For example, if a 30 Å loss is expected during a subsequent silicon nitride mask etch and a 500 Å spacer is used, a 70 Å thick stop layer may be required. However, a stop layer that is too thick is not desirable since longer wet dip is required to remove the nitride prior to an ONO deposition.

Any suitable technique for forming the stop layer 70 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or high density plasma chemical vapor deposition (HDPCVD) techniques to a suitable thickness.

Figure 10:
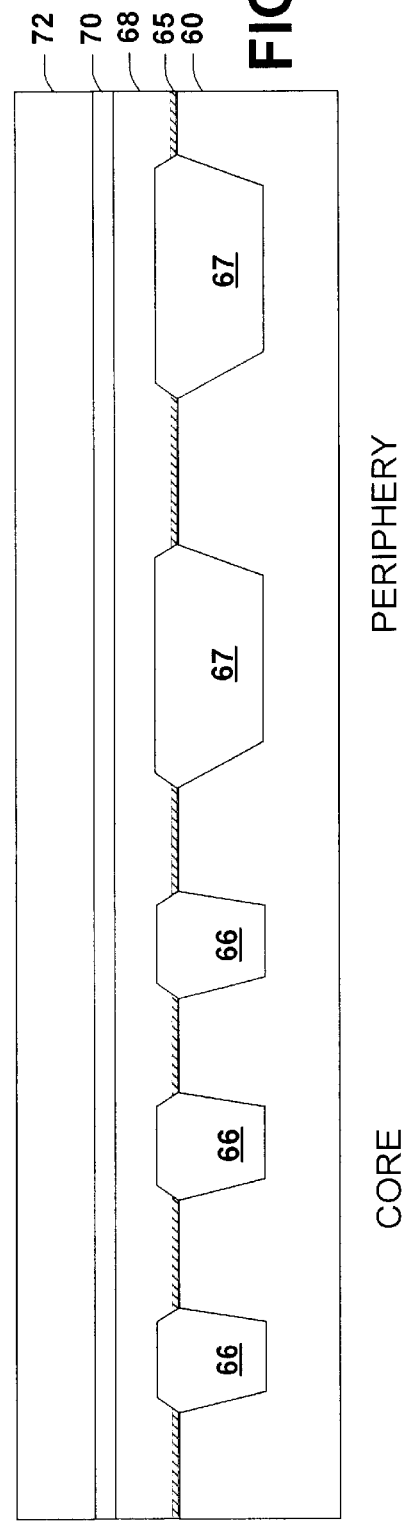
FIG. 10 is a schematic cross-sectional illustration of the structure of FIG. 9 after deposition of a mask layer over the stop layer in accordance with the present invention.

FIG. 10 illustrates silicon nitride layer 72 being laid down on the stop layer 70. Any suitable technique (e.g., thermal oxidation, plasma enhanced chemical vapor deposition (CVD), thermal enhanced CVD and spin on techniques) may be employed in forming the silicon nitride layer 72. The silicon nitride layer 72 is provided to act as a hard mask for etching spaces in the polysilicon layer 68 overlying the trench isolation regions 66 and 67. The deposition thickness of the silicon nitride layer 72 is determined by both the lithographic and etch requirements for forming the trenches in the polysilicon layer 68. For example, for a lithographic minimum width of 0.14 μm for creating a space width of 0.07 μm using the spacer formation process of the present invention, the silicon nitride thickness should be about 900 Å to about 1500 Å for the lithographic steps and about 750 Å to about 900 Å ? for the etch steps. This estimate is based on the silicon nitride layer losing about 1000 Å during the process steps to follow (SiN space etch: about 100 Å to about 400 Å, stop layer removal etch: about 50 Å to about 150 Å, polysilicon etch: about 400 Å, total thickness: about 1000 Å) leaving a process margin of about 300 Å. In one aspect of the invention, the stop layer 70 has a thickness of about 50 Å to about 150 Å and the silicon nitride layer 72 has a thickness of about 100 Å to about 400 Å, while the polysilicon layer 68 has a thickness of about 900 Å to about 1500 Å.

Figure 11:
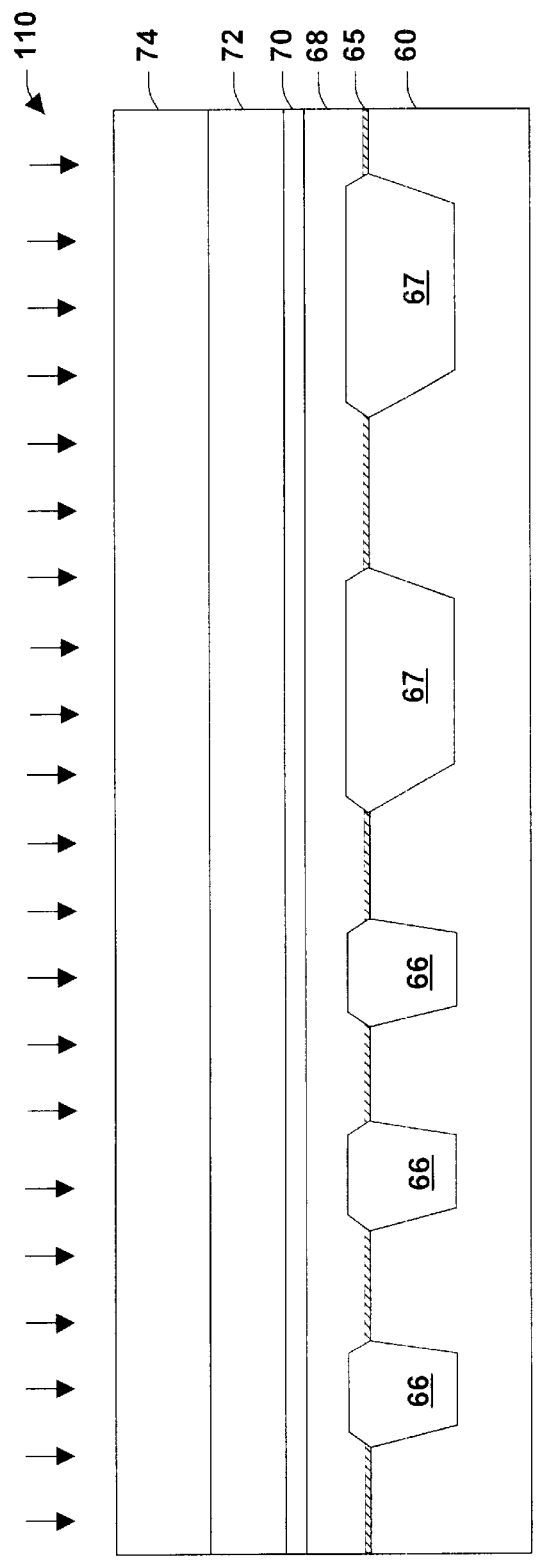
FIG. 11 is a schematic cross-sectional illustration of the structure of FIG. 10 undergoing an etch step on a photoresist layer deposited on the mask layer in accordance with the present invention.
Figure 12:
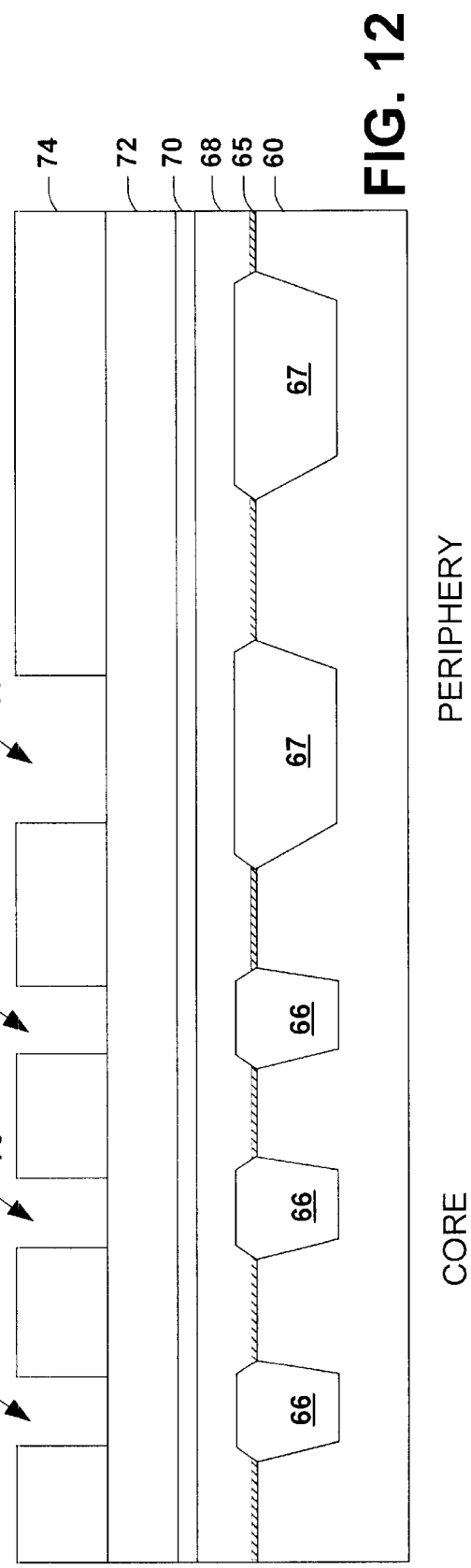
FIG. 12 is a schematic cross-sectional illustration of the structure of FIG. 11 after undergoing an etch step on the photoresist layer to form a patterned photoresist layer in accordance with the present invention.

FIG. 11 illustrates forming a photoresist layer 74 on the silicon nitride layer 72 and performing an etch step 110 on the photoresist layer 74. The photoresist layer 74 may be formed over the silicon nitride layer 72 via conventional spin-coating or spin casting deposition techniques. The photoresist layer 74 has a thickness suitable for functioning as a mask for etching the silicon nitride layer 72. The photoresist layer 74 is patterned using conventional techniques to form openings 76 and 77 (FIG. 12) in the photoresist layer 74. The size of the openings are about the size of the ultimate spaces to be etched in the silicon nitride layer 72. The patterned photoresist 74 serves as an etch mask layer for processing or etching spaces into the underlying silicon nitride layer 72.

The photoresist layer 74 is patterned via a photolithographic tool set (e.g., deep ultra-violet (DUV)) tool set capable of patterning lines separated by distances equal to or greater than 0.14 μm). The patterned photoresist layer 74 will serve as a mask for the underlying layers during etch steps to form spaces between lines. The distance $d_1$ is representative of the smallest space parameter consistently achievable by the photolithographic tool set.

An etch step 120 (e.g., anisotropic reactive ion etching (RIE)) (FIG. 13) is performed to form spaces 78 and 79 (FIG. 14) in the silicon nitride layer 72. The patterned photoresist 74 is used as a mask for selectively etching the silicon nitride layer 72 to provide a patterned silicon nitride layer 72. Any suitable etch technique may be used to etch the silicon nitride layer 72. For example, the silicon nitride layer 72 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 74 to thereby create the spaces 78 and 79 in the silicon nitride layer 72. Preferably, a selective etch technique is used to etch the material of the silicon nitride layer 72 at a relatively greater rate as compared to the rate that the material of the patterned photoresist 74 is etched. Additionally, the selective etch technique is used to etch the silicon nitride layer 72 at a relatively greater rate than the underlying stop layer 70.

FIG. 15 illustrates the memory devices after a stripping step is performed (e.g., ashing in an $O_2$ plasma) to remove remaining portions of the photoresist layer 74. FIG. 16 illustrates the memory device 10 after a nitride deposition step is performed form a nitrogen layer conformal to the exposed surface of the memory device. More particularly, the etched silicon nitride layer 72 is exposed to a nitrogen based chemistry to form a conformal nitride coating 80 (FIG. 16) on the silicon nitride layer 72. It is to be appreciated that one skilled in the art could readily tailor without undue experimentation a suitable chemistry to form the conformal nitride coating 80. The etch chemistry and duration thereof may be suitably tailored to form the nitride coating at substantially any desired thickness (e.g., between about the range of 10–1000 Å).

Figure 17:
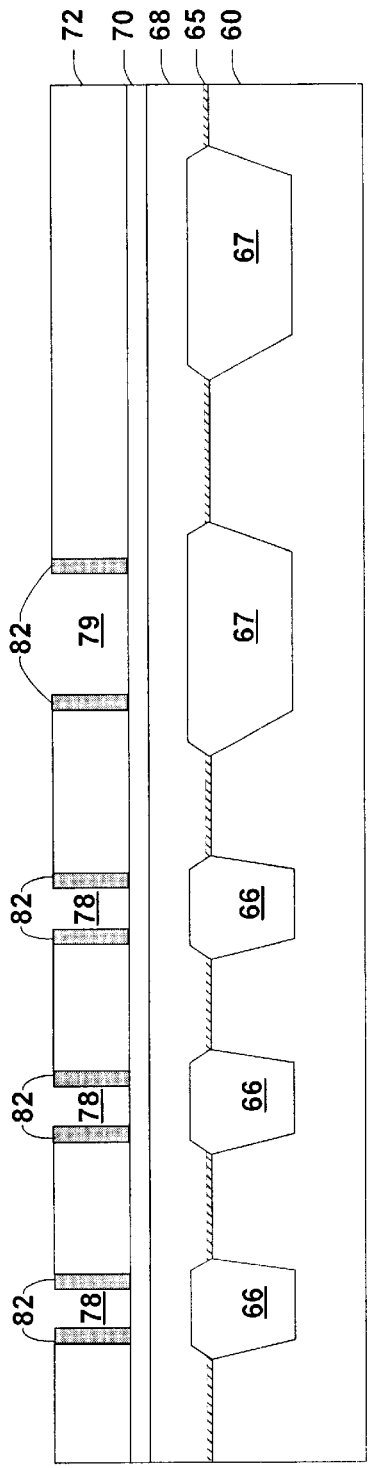
FIG. 17 is a schematic cross-sectional illustration of the structure of FIG. 16 after undergoing the directional etch step in accordance with the present invention.

FIG. 17 illustrates the memory device after undergoing a directional etch to remove a predetermined thickness of the nitride layer 80. Preferably, a dry directional etch is performed to remove an amount of the nitride layer 80 equivalent to the conformal thickness of the nitride layer 80. The memory device includes nitride sidewalls 82 which result in exposed portions of the polysilicon layer 68 having a dimension of $d_2$. The dimension $d_2$ is less than the dimension $d_1$ (FIG. 1). The dimension $d_2$ may be controlled via the controlling the thickness ($\gamma$) of the nitride layer 80. For example, the dimension $d_2$ may be controlled according to the following relationship:

$$d_2 = d_1 - 2\gamma$$

Since there are two nitride sidewalls 82 within a particular dimension $d_1$, the value of $d_2$ equals $d_1$ less twice the nitride layer thickness ($\gamma$).

Figure 18:
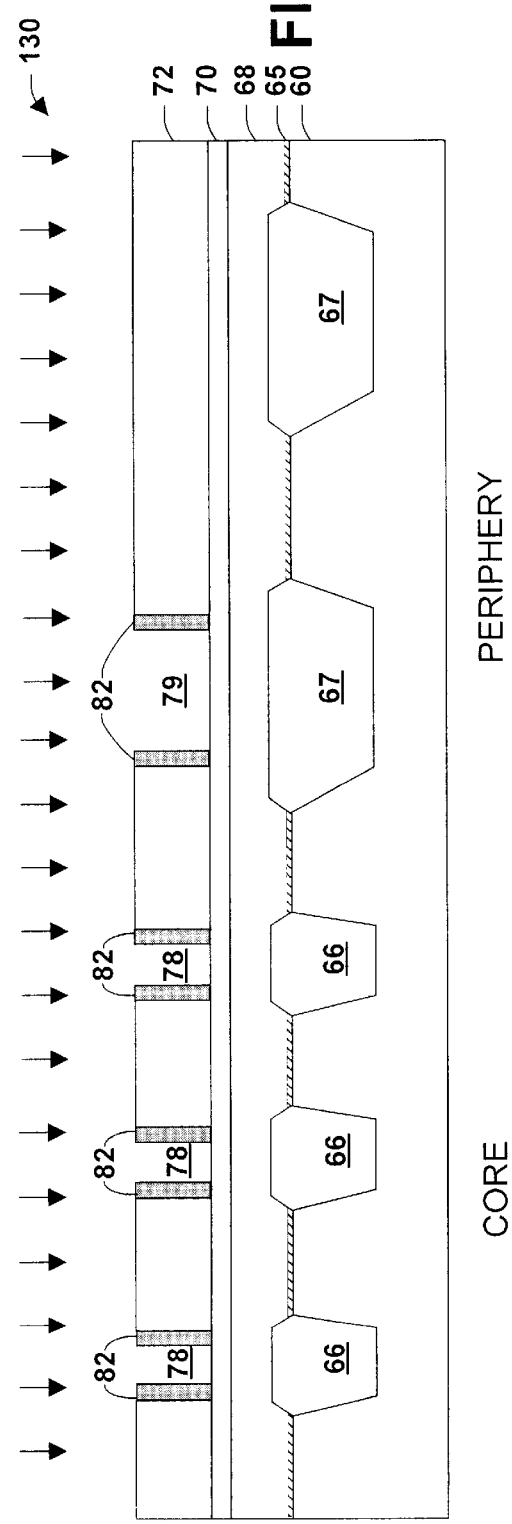
FIG. 18 is a schematic cross-sectional illustration of the structure of FIG. 17 undergoing a poly etch step in accordance with the present invention.
Figure 19:
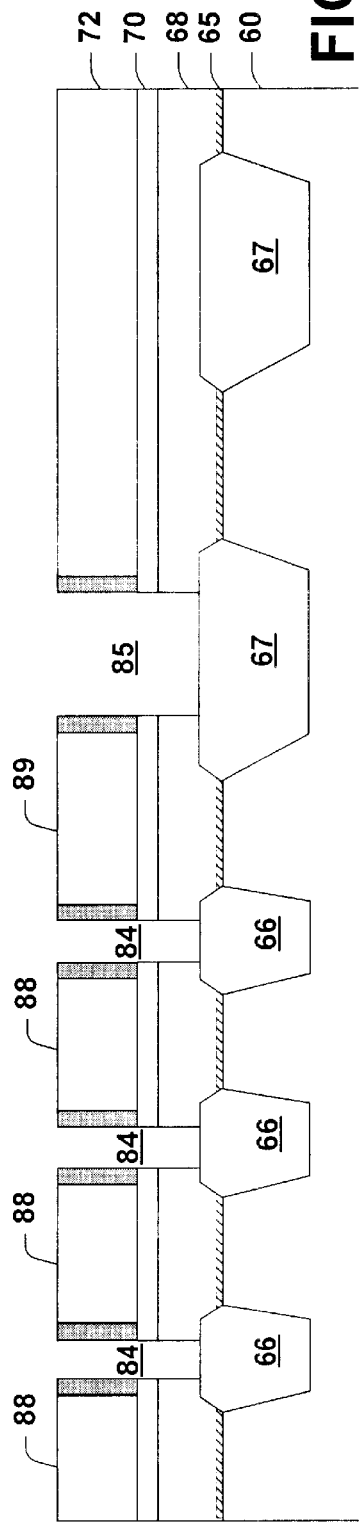
FIG. 19 is a schematic cross-sectional illustration of the structure of FIG. 18 after undergoing a poly etch step in accordance with the present invention.
Figure 20:
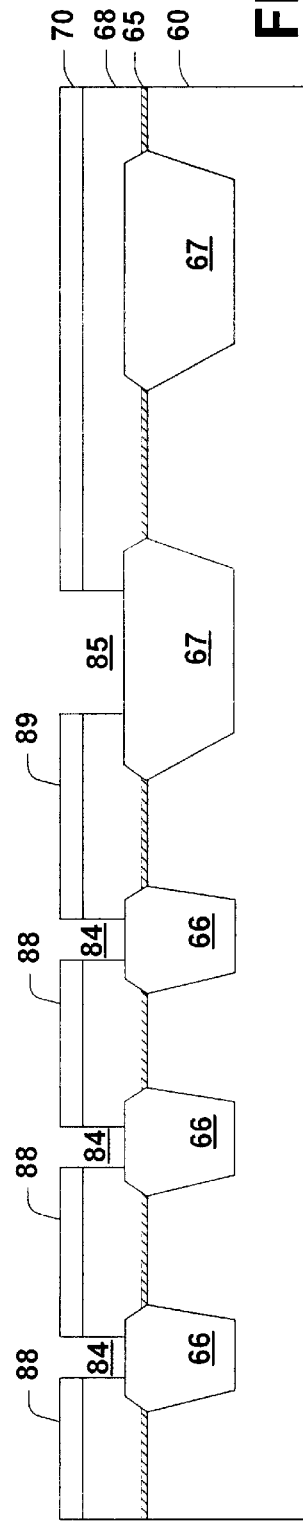
FIG. 20 is a schematic cross-sectional illustration of the structure of FIG. 19 after stripping of the mask layer in accordance with the present invention.

Next, referring to FIG. 18, a poly etch 130 is performed to etch exposed portions of the stop layer 70 and the polysilicon layer 68 so as to form lines 88 (FIG. 19) in the core region having spaces 84 there between, respectively, of $d_2$ and line 89 with space 85 and 84 on opposite ends of line 89 in the periphery region. FIG. 20 illustrates the memory device after a stripping step to remove remaining portions of the silicon nitride layer 72 and nitride sidewalls 82.

Figure 21:
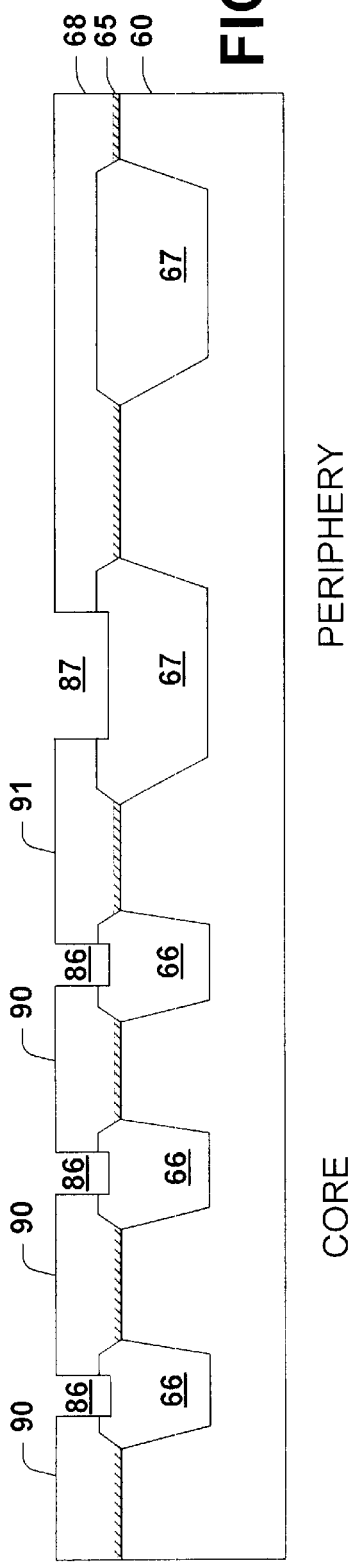
FIG. 21 is a schematic cross-sectional illustration of the structure of FIG. 20 after stripping of the stop layer in accordance with the present invention.

FIG. 21 illustrates the memory device after removal of the stop layer 70. The memory device includes the line 91 with space 87 and 86 on opposite ends of line 91 in the periphery region. The memory device 10 includes the lines 90 in the core region having spaces 86 therebetween with a dimension equal to $d_2$. Thus, for example, if a 0.12 μm tool set were employed to pattern the photoresist 74 with a spacing dimension $d_1$=0.14 μm and the nitride layer 80 was formed to have a thickness ($\gamma$) of 0.035 μm, the resulting spacing dimension between adjacent lines 90 would be approximately 0.07 μm=(0.14 μm−2(0.035 μm)). The minimum space dimension ($d_M$) for the 0.12 μm tool set employed is 0.12 μm, and such minimum space dimension typically would be difficult to achieve consistently in accordance with conventional techniques. However, by employing the present invention the same 0.12 μm tool set can be employed to achieve with substantial consistency minimum space dimensions between lines at and below the minimum space dimension parameter of the tool set.

Employing the present invention achieves with substantial consistency minimum space dimensions between lines at and below the minimum space dimension parameter of a particular tool set employed. Although the present invention has been described primarily in the context of forming lines, it is to be appreciated that the present invention may be applied to forming other features (e.g., floating gates of flash memory devices and/or embedded flash memory devices) where achieving small space dimension between adjacent features is desired. The present invention provides for a method for employing a particular photolithographic tool set to obtain minimum space dimensions well below the minimum space parameters typically obtainable by the tool set.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming spaces between lines in a memory device, comprising:
   forming STI regions in a substrate to isolate memory cells in the memory device;
   patterning a photoresist layer, wherein $d_1$ is a smallest space dimension of an exposed area of a mask layer underlying the photoresist layer;
   etching the mask layer;
   forming a nitride layer to be conformal to the patterned mask layer and exposed portions of an underlayer underlying the patterned mask layer;
   etching the nitride layer to form nitride sidewalls, the nitride sidewalls reducing the smallest space dimension of the exposed underlayer area to $d_2$, wherein $d_2 < d_1$; and
   etching the exposed underlayer to form lines and spaces in the underlayer, the spaces having a smallest space dimension of $d_2$.

2. The method of claim 1, the underlayer being a polysilicon layer.

3. The method of claim 2, the polysilicon layer being a first polysilicon layer in a memory device comprising a plurality of floating gate memory cells.

4. The method of claim 1, the mask layer being a silicon nitride layer.

5. The method of claim 4, the silicon nitride layer have a thickness of about 900 Å to about 1500 Å.

6. The method of claim 1, further comprising forming a stop layer over the underlayer and forming the mask layer over the stop layer.

7. The method of claim 6, the stop layer being a high temperature oxide having a thickness of about 50 Å to about 150 Å.

8. The method of claim 1, the spaces being disposed above the STI regions in a core region of the memory device.

9. The method of claim 1, further comprising forming the nitride layer to have a thickness (γ) with the range of about 100 Å to about 400 Å.

10. The method of claim 1, further comprising using a dry directional etch to etch the nitride layer.

11. The method of claim 1, further comprising predetermining the dimension $d_2$ according to the relationship $d_2 = d_1 - 2\gamma$, wherein γ is a thickness of the nitride layer.

12. A method for producing a small space pattern in a polysilicon layer of a memory device having memory cells isolated from one another utilizing STI regions between memory cells, the method comprising:
   providing a substrate for forming a memory device;
   forming STI regions in the substrate to isolate memory cells in the memory device;
   forming a polysilicon layer over the substrate and STI regions;
   planarizing the polysilicon layer;
   forming a mask layer over the polysilicon layer;
   forming a photoresist layer over the mask layer;
   patterning the photoresist layer with a photolithographic tool set, a minimum printed space dimension of the patterned photoresist being $d_1$, wherein $d_1$ is the smallest space dimension consistently printable by the photolithographic tool set;
   etching the mask layer utilizing the patterned photoresist to form a patterned mask layer;
   forming a nitride layer to be conformal to the patterned mask layer underlying the photoresist layer and exposed portions of the polysilicon layer underlying the mask layer, $d_1$ being the smallest dimension of the exposed portions; and
   etching the nitride layer an amount substantially equivalent to a minimum thickness parameter (γ) of the nitride layer to leave nitride sidewalls such that the smallest dimension of the exposed portions is now $d_2$, wherein $d_2 < d_1$; and
   etching the exposed portions of the polysilicon layer to form lines and spaces in the polysilicon layer, the spaces having a smallest space dimension of $d_2$.

13. The method of claim 12, the memory device comprising a plurality of floating gate memory cells and the polysilicon layer forming the floating gate portion of the memory cells.

14. The method of claim 12, the mask layer being a silicon nitride layer.

15. The method of claim 14, the silicon nitride layer having a thickness of about 900 Å to about 1500 Å.

16. The method of claim 12, further comprising forming a stop layer over the polysilicon layer and forming the mask layer over the stop layer.

17. The method of claim 16, the stop layer being a high temperature oxide having a thickness of about 50 Å to about 150 Å.

18. The method of claim 12, the spaces being disposed above the STI regions in a core region of the memory device.

19. The method of claim 12, further comprising forming the nitride layer to have a thickness (γ) within the range of about 100 Å to about 400 Å.

20. The method of claim 12, further comprising using a dry directional etch to etch the nitride layer.

21. The method of claim 12, further comprising predetermining the dimension $d_2$ according to the relationship $d_2 = d_1 - 2\gamma$, wherein γ is a thickness of the nitride layer.

22. The method of claim 12, the space dimension $d_2$ being about 0.07 μm and the space dimension $d_1$ being about 0.14 μm.

23. A method of forming closely spaced ties in a polysilicon layer that forms a floating gate region of floating gate memory cells in a memory device, the method comprising:

using a semiconductor structure comprising: a substrate; STI regions disposed in the substrate to isolate adjacent memory cells; a polysilicon layer over the STI regions and the substrate; a silicon nitride layer over the polysilicon layer, wherein a smallest dimension of at least one exposed portion of the polysilicon layer equals $d_1$;

forming a nitride layer to conform to an exposed surface of the semiconductor structure;

etching the nitride layer so as to leave nitride portions along sidewalls of the silicon nitride layer, the nitride portions reducing the smallest dimension of the at least one exposed portion of the polysilicon layer to $d_2$, wherein $d_2 < d_1$; and etching the exposed portions of the polysilicon layer to form lines and spaces in the polysilicon layer, the spaces having a smallest space dimension of $d_2$.

24. The method of claim 23, the polysilicon layer over the STI regions and the substrate being planarized using a chemical mechanical polish.

25. The method of claim 23, the silicon nitride layer having a thickness of about 900 Å to about 1500 Å.

26. The method of claim 23, the spaces being disposed above the STI regions.

27. The method of claim 23, further comprising forming the nitride layer to have a thickness ($\gamma$) within the range of about 100 Å to about 400 Å.

28. The method of claim 23, further comprising using a dry directional etch to etch the nitride layer.

29. The method of claim 23, the space dimension $d_2$ being about 0.07 $\mu$m and the space dimension $d_1$ being about 0.14 $\mu$m.

* * * * *